United States Patent
Gaudin et al.

(10) Patent No.: US 10,622,046 B2
(45) Date of Patent: Apr. 14, 2020

(54) MAGNETIC MEMORY CELL

(71) Applicants: Centre national de la recherche scientifique, Paris (FR); Commissariat à l'énergie atomique et aux énergies alternatives, Paris (FR)

(72) Inventors: Gilles Gaudin, Le Sapey en Chartreuse (FR); Ioan Mihai Miron, Grenoble (FR); Olivier Boulle, Grenoble (FR); Safeer Chenattukuzhiyil, Kerala (IN)

(73) Assignees: CENTRE NATIONAL DE LA RECHERCHE SCIENTIFIQUE, Paris (FR); COMMISSARIAT À L'ÉNERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 46 days.

(21) Appl. No.: 15/766,236

(22) PCT Filed: Oct. 5, 2016

(86) PCT No.: PCT/FR2016/052565
§ 371 (c)(1),
(2) Date: Apr. 5, 2018

(87) PCT Pub. No.: WO2017/060626
PCT Pub. Date: Apr. 13, 2017

(65) Prior Publication Data
US 2018/0294023 A1    Oct. 11, 2018

(30) Foreign Application Priority Data
Oct. 8, 2015 (FR) .................................. 15 59584

(51) Int. Cl.
*G01R 33/09* (2006.01)
*G11C 11/16* (2006.01)
(Continued)

(52) U.S. Cl.
CPC ........ *G11C 11/161* (2013.01); *G11C 11/1659* (2013.01); *G11C 11/1675* (2013.01); *H01L 43/08* (2013.01); *H01L 43/10* (2013.01)

(58) Field of Classification Search
CPC ............................. G01R 33/09; G11C 11/161
(Continued)

(56) References Cited

U.S. PATENT DOCUMENTS

| | | |
|---|---|---|
| 6,707,122 B1 * | 3/2004 | Hines .................... G01R 33/09 257/414 |
| 8,416,618 B2 | 4/2013 | Gaudin et al. |

(Continued)

OTHER PUBLICATIONS

International Search Report dated Jan. 13, 2017 in International Application No. PCT/FR2016/052565.

*Primary Examiner* — Jason Lappas
(74) *Attorney, Agent, or Firm* — B. Aaron Schulman, Esq.; Stites & Harbison, PLLC

(57) ABSTRACT

The invention relates to a magnetic memory cell (30), comprising: a stack (31) including a magnetic layer section (34) between a conductive layer section (32) and a section (36) of a layer that is different from the conductive layer, the magnetic layer having a magnetisation (35) perpendicular to the plane of the layers; a metallisation section (42) on which the stack is placed; and first, second, third and fourth metallisation arms (44D to 44G), each arm having a median axis (45D to 45G), wherein, for each arm, a current flowing towards the stack in the direction of the median axis sees that portion of the stack which is closest the arm mostly on its left for the first and second arms (44E, 44G), and mostly on its right for the third and fourth arms (44D, 44F).

16 Claims, 9 Drawing Sheets

(51) Int. Cl.
*H01L 43/08* (2006.01)
*H01L 43/10* (2006.01)

(58) Field of Classification Search
USPC .......................................................... 257/414
See application file for complete search history.

(56) References Cited

U.S. PATENT DOCUMENTS

| | | |
|---|---|---|
| 2009/0273972 A1 | 11/2009 | Han et al. |
| 2010/0207220 A1 | 8/2010 | Kim et al. |
| 2012/0020152 A1 | 1/2012 | Gaudin et al. |
| 2014/0110004 A1 | 4/2014 | Westmeier et al. |

\* cited by examiner

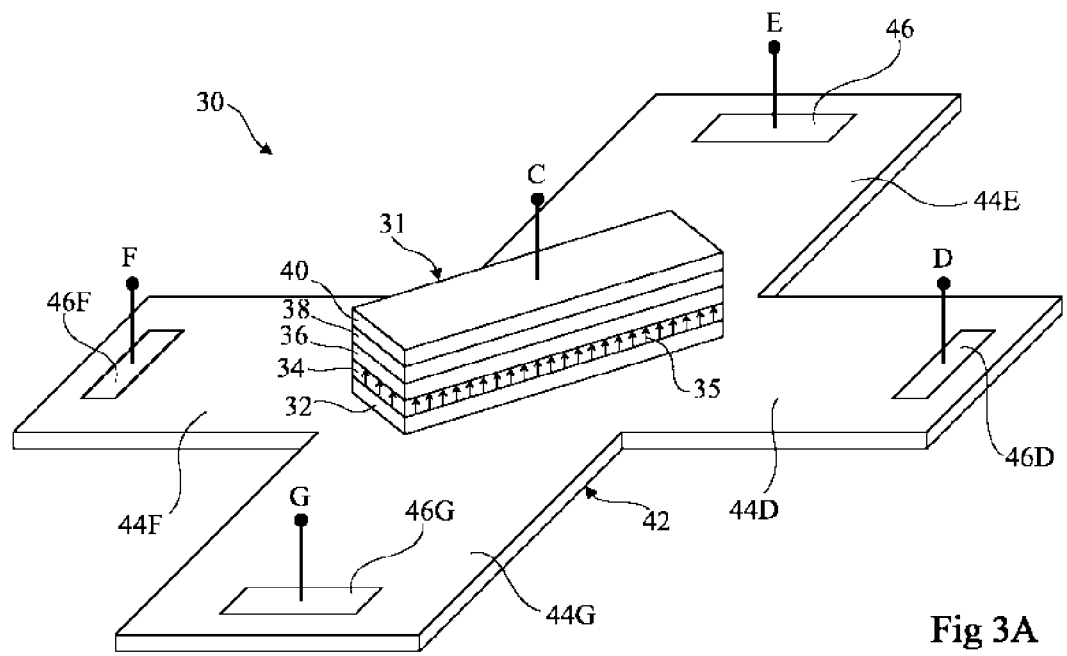
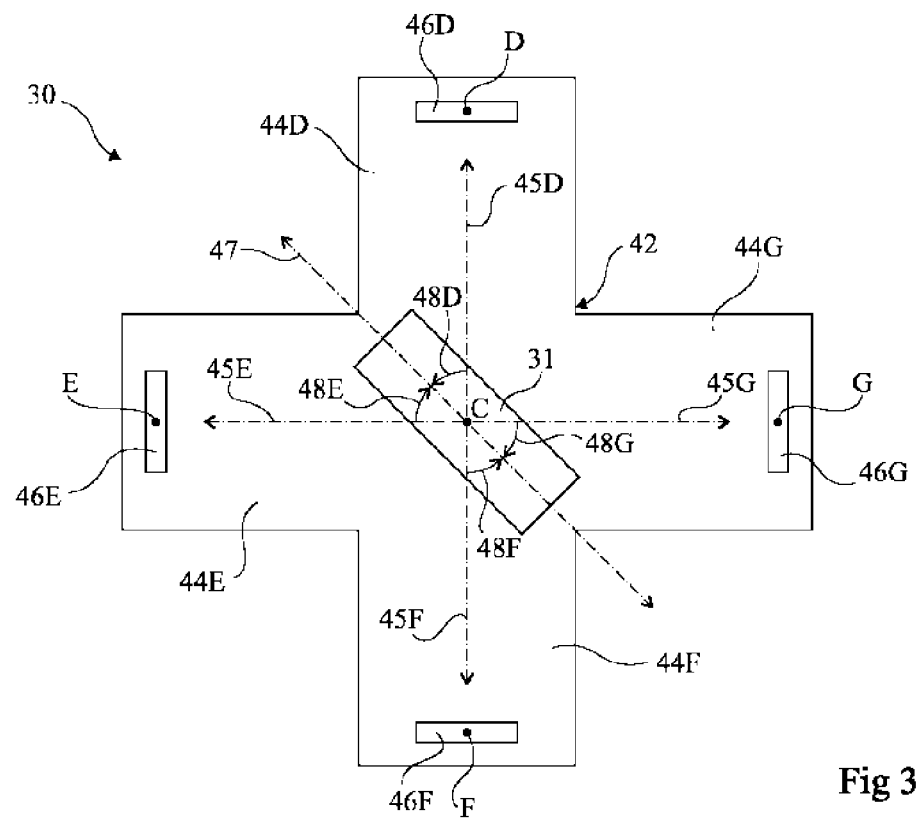
Fig 3A
Fig 3B

MAGNETIC MEMORY CELL

The present patent application claims the priority of French patent application FR15/59584, which will be considered an integral part of the present description.

FIELD

The present invention relates to a magnetic memory cell, and more particularly a magnetic memory cell of the type with current-induced reversal.

BACKGROUND OF THE INVENTION

French patent no. 2,963,152 describes a magnetic memory cell as schematically shown in FIGS. 1A, 1B and 1C. FIGS. 1A and 1B below respectively show a sectional view and perspective view of a magnetic memory cell as described in connection with FIGS. 1c-1f, 2a-2b and 3a-3d of French patent no. 2,963,152. FIG. 1C is a simplified top view of this memory cell.

As illustrated by FIGS. 1A and 1B, this memory cell comprises a stack 3 above a conductive track 1. The stack 3 comprises a stack of regions, each of which is formed by a section of a thin layer or a stack of several thin layers. The conductive track 1 is for example formed on a substrate 5 made up of a silicon wafer coated with a layer of silicon oxide and is connected across the terminals A and B. The stacking making up the stack 3 successively comprises, from the track 1, a region 10 made from a nonmagnetic conductive material, a region 11 made from a magnetic material, a region 12 made from a nonmagnetic material, a region 13 made from a magnetic material and an electrode 14. The material of the layer 12 can be conductive; this is preferably an insulating material thin enough to be able to be traversed by tunnel effect electrons. There is a structural difference between the nonmagnetic regions 10 and 12 so as to have an asymmetrical system in a direction orthogonal to the plane of the layers. This difference can in particular result from a difference in material, thickness, or growth mode of these layers.

Lists of materials able to make up the various layers are given in the aforementioned patent application. The magnetic materials of the regions 11 and 13 are formed under conditions such that they have a magnetization oriented orthogonally to the plane of the layers. The magnetic material of the layer 13 is formed under conditions such that it retains an intangible magnetization (trapped layer). The upper electrode layer 14 is connected to a terminal C.

The programming of the memory cell is done by causing a current to flow across the terminals A and B, while a field H oriented horizontally (parallel to the plane of the layers and to the direction of the current across the terminals A and B) is applied. Depending on the relative directions of the current between the terminals A and B and the field vector H, the layer 11 is programmed such that its magnetization is oriented upward or downward.

To read this memory cell, a voltage is applied across the terminal C and one or the other of the terminals A and B. The resulting current across the terminal C and the one of the other of the terminals A and B assumes different values depending on the relative direction of the magnetizations of the layers 11 and 13: high value if the two magnetizations are in the same direction and low value if the two magnetizations have opposite directions.

One characteristic of the memory cell described above is that its programming is done owing to a current flowing across the terminals A and B and a magnetic field applied in the plane of the layers, parallel to the current. No current flows from the terminal A or B toward the terminal C during programming. This has the advantage of completely separating the read and write operations of the memory cell.

Many alternative embodiments are possible. In particular, each layer previously described can be made up of a stack of layers in a manner known in the art to acquire the desired characteristics.

The layer section 10 made from a conductive nonmagnetic material can be omitted, as long as the track 1 is made from a nonmagnetic material suitable for the growth of the magnetic layer 11. The track 1 may then have an overthickness below the stack 3. For the reversal of the magnetization in the layer 11 to be possible, it is also necessary for spin-orbit couplings to be present in the magnetic layer. To that end, it is for example necessary for the layer in contact with this layer 11 (or separated from it by a fine separating layer) to be made up of a material or formed from materials with a high spin-orbit coupling. Another solution is for example for the contact between the magnetic layer 11 and one or the other of the layers 10 and 12 to create this spin-orbit coupling; this may for example be done by hybridization of the magnetic layer 11 with the layer 12 if the latter is made from an insulator (see "Spin-orbit coupling effects by minority interface resonance states in single-crystal magnetic tunnel junctions", Y. Lu et al. Physical Review B, Vol. 86, p. 184420 (2012)).

It will be noted that the memory cell of FIGS. 1A and 1B can be broken down into two elements: a storage element comprising the track 1 provided with the terminals A and B and the layer sections 10, 11 and 12, and a read element comprising, in the example given above, the layers 13 and 14 and the electrode C. With the same storage element, various read modes could be considered, for example optical reading.

FIG. 1C is a simplified top view of the stack 3. Only the track 1 and the stack 3 are shown, as well as the terminals A and B connected to contacts 15 and 16.

As previously indicated, this memory cell is programmable by applying a current across the terminals A and B simultaneously with the application of a magnetic field having a nonzero component in the direction of the current. Examples of means for generating a magnetic field are given in the aforementioned patent application. The application of an outside field or the production of specific magnetic layers able to create the field H raises practical production problems.

Patent application US 2014/0110004 describes a magnetic memory cell that can be programmed by applying a current without a magnetic field. FIG. 2 is a schematic bottom view of a magnetic memory cell corresponding to FIGS. 15C, 16C and 17C of this patent application. A magnetic field 20 comprises a stack of sections of layers similar to the layers of the magnetic stack 3 described in relation with FIGS. 1A to 1C. The stack 20 has an elongated rectangular shape and comprises, on the side of one of its large sides, a section 22 that, seen from above, extends in a direction orthogonal to the large side. The two opposite ends of the rectangle are connected to terminals A and B by contacts 24A and 24B. The section 22 imparts an asymmetry to the stack 20 that makes it possible to program the memory cell simply by applying a direct current. The direction of flow of the current, from the terminal A toward the terminal B or from the terminal B toward the terminal A, defines the programmed value.

The programming of this memory cell depends on the flow direction of the direct current traversing the device.

It is desirable to have a memory cell whose programming does not depend on the direction of a current flowing between two programming terminals, the current being able to have any polarity or even in particular to be alternating.

BRIEF DESCRIPTION OF THE INVENTION

Thus, one embodiment provides a magnetic memory cell, comprising: a stack including a magnetic layer section between a conductive layer section and a section of the layer that is different from the conductive layer, the magnetic layer having a magnetization perpendicular to the plane of the layers; a metallization section on which the stack is placed; and first, second, third and fourth metallization arms, each arm having a median axis, wherein, for each arm, a current flowing towards the stack in the direction of the median axis sees that section of the stack which is closest to the arm mostly on its left for the first and second arms, and mostly on its right for the third and fourth arms.

According to one embodiment, the magnetic layer has a thickness smaller than 3 nm.

According to one embodiment, the magnetic memory cell has, in top view, a center of symmetry.

According to one embodiment, the magnetic memory cell has a plane of symmetry perpendicular to the plane of the layers, the first and third arms being symmetrical to one another relative to the plane of symmetry and at the second and fourth arms being symmetrical to one another relative to the plane of symmetry.

According to one embodiment, for each arm, the part of the stack closest to the arm comprises a portion elongated in a direction forming, in top view, an acute angle with the median axis of the arm.

According to one embodiment, at least one of said acute angles is comprised between 30° and 60°.

According to one embodiment, at least one of said elongated portions forms a tip.

According to one embodiment, at least one of said elongated portions forms a rounded tip.

According to one embodiment, the metallization portion and the first, second, third and fourth arms form a cross, the stack being elongated and being positioned at the center of the cross.

According to one embodiment, the stack comprises a central portion elongated in a direction forming an angle comprised between 0° and 30°, preferably between 5° and 25°, with the median axis of the third arm.

According to one embodiment, the median axes of the first and second arms are substantially collinear and the median axes of the third and fourth arms are substantially collinear, the stack having an elongated shape centered on the meeting point of the axes, and said acute angles being comprised between 30° and 45°.

According to one embodiment, the median axes of the first and third arms are substantially collinear and the median axes of the second and fourth arms are substantially collinear, the median axes of the first and second arms being substantially parallel, and the first and second arms extending in opposite directions.

According to one embodiment, the median axes of the second and third arms are substantially collinear and the median axes of the first and fourth arms are substantially orthogonal to the median axes of the first and third arms.

Another embodiment provides a method for programming a memory cell, comprising a step consisting of passing a first current between the first and second arms or a second current between the third and fourth arms.

According to one embodiment, the first or second current is an alternating current.

BRIEF DESCRIPTION OF THE DRAWINGS

These features and advantages, as well as others, will be described in detail in the following description of specific embodiments provided non-limitingly in reference to the attached figures, in which:

FIGS. 3A and 3B are respectively a schematic perspective view and a schematic top view of one embodiment of a magnetic memory cell;

DETAILED DESCRIPTION OF THE INVENTION

Figure 1A:
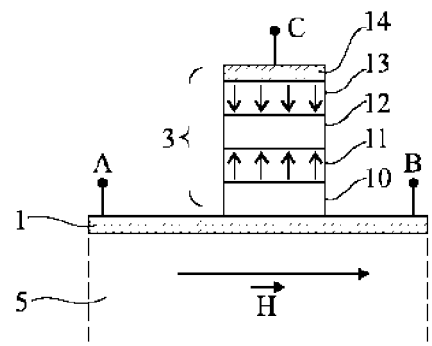
FIGS. 1A and 1B are a schematic sectional view and a schematic perspective view, respectively, of a magnetic memory cell.

Same elements have been designated by same references in the various figures and, furthermore, the different figures are not drawn to scale. For clarity reasons, only the elements that are useful to understand the described embodiments have been shown and are outlined.

In the following description, unless otherwise specified, when reference is made to absolute position descriptors, such as the terms "top", "bottom", "left", "right", etc., or relative terms, such as "above", "below", "upper", etc., reference is being made to the orientation of the element in question in FIGS. 1A, 1B, 3A and 4. Unless otherwise specified, the expressions "approximately", "substantially" and "about" mean to within 10%, preferably to within 5%, or, regarding an orientation, to within 15 degrees, preferably to within 10 degrees.

FIGS. 3A and 3B are respectively a schematic perspective view and schematic top view of one embodiment of a magnetic memory cell 30.

The magnetic memory cell 30 comprises a stack 31 formed by a stack of layer portions. The stack 31 comprises, from bottom to top, a conductive layer portion 32, a programmable magnetic layer portion 34 having a magnetization 35 orthogonal to the plane of the layers, a nonmagnetic layer portion 36 different from the layer 32, a magnetic layer portion 38 and an electrode 40. The electrode 40 is connected to a terminal C. The layers 32, 34, 36, 38 and 40 are similar to the thin layers forming the respective regions 10, 11, 12, 13 and 14 described in connection with FIGS. 1A to 10. In particular, the alternatives described in connection with FIGS. 1A to 10 are applicable.

The stack 31 is positioned on the central portion of a metallization 42 having, in top view, the shape of a cross with four arms. The four arms 44D, 44E, 44F and 44G have median axes 45D, 45E, 45F, 45G forming right angles. The arms are connected to respective terminals D, E, F and G by respective contacts 46D, 46E, 46F and 46G located at the ends of the arms. In top view, the stack 31 is in the shape of a rectangle elongated in a direction 47 forming acute angles substantially equal to 45 degrees with the axes 45D, 45E, 45F and 45G.

The acute angles 48D and 48F between the axes 45D and 45F of the opposite arms 44D and 44F and the direction 47 are oriented in the counterclockwise direction. The acute angles 48E and 48G between the axes 45E and 45G of the opposite arms 44E and 44G and the direction 47 are oriented in a clockwise direction. In this configuration, an observer placed on one or the other of the opposite arms 44E and 44G looking at the stack along the axes 45D and 45F sees, on his right, the part of the stack closest to him. An observer placed on one of the other of the opposite arms 44E and 44G looking at the stack along the axis 45E and 45G sees, on his left, the part of the stack closest to him.

During operation, the memory cell 30 is connected to a device suitable for causing a current to flow across the opposite terminals D and F or across the opposite terminals E and G.

To program the memory cell 30, the inventors have observed that a first orientation is imposed on the magnetization 35 by the flow of a current across the opposite terminals D and F, and that a reverse orientation is imposed by a current flowing between the opposite terminals E and G. These orientations are imposed irrespective of the direction of the current flowing across the terminals D and F, E and G respectively.

Figure 4:
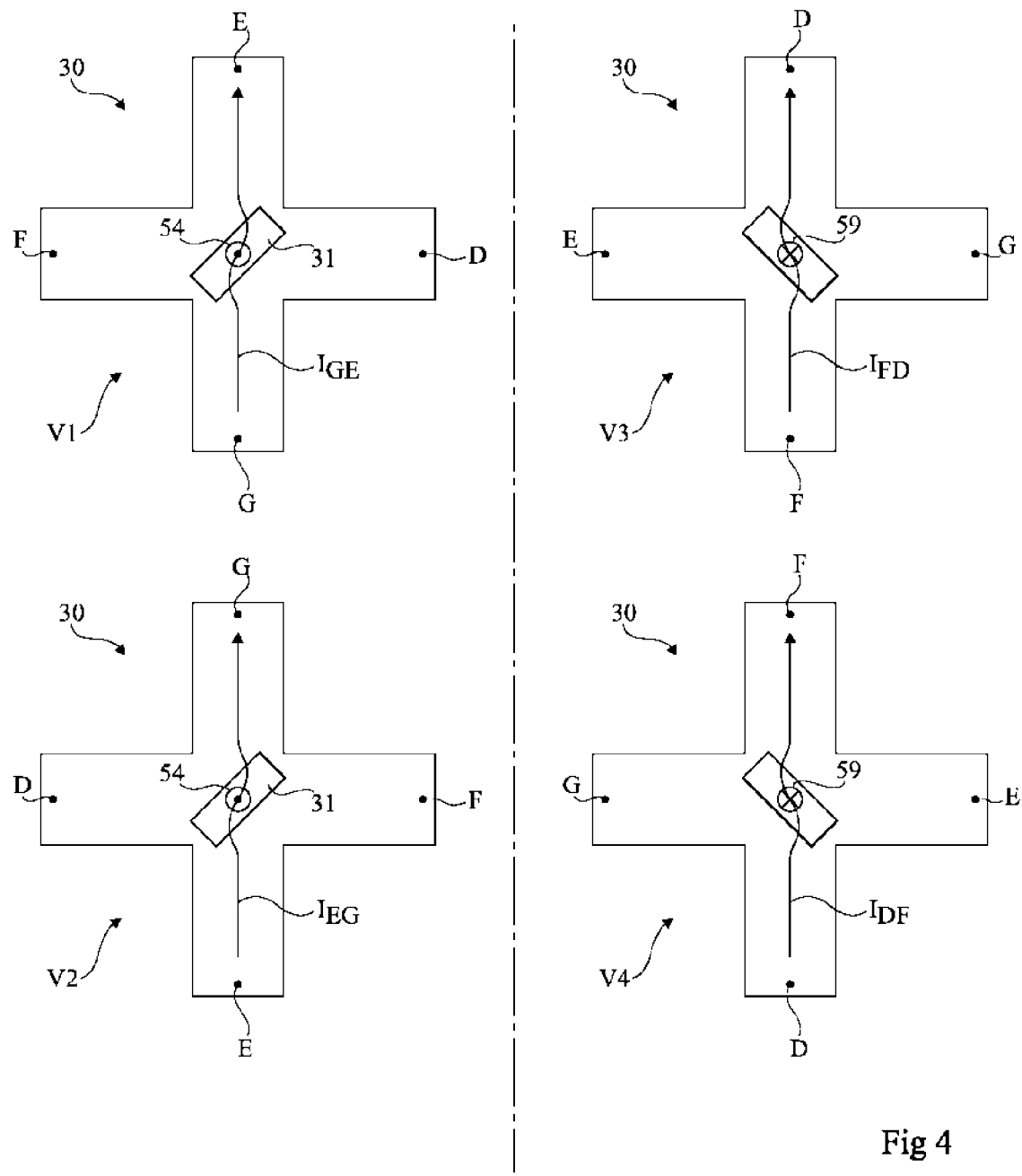
FIG. 4 illustrates the operation of the embodiment shown in FIG. 3.

FIG. 4 shows four schematic top views V1 to V4 illustrating the operation of the memory cell 30. View V2 corresponds to view V1 after a 180° rotation, view V3 corresponds to view V1 after a 90° rotation counterclockwise, and view V4 corresponds to view V3 after a 180° rotation. The orientation of each of views V1 to V4 is such that the flows of currents are shown in identical directions, from bottom to top.

In view V1 in the top left of FIG. 4, the terminal E is located at the top of the figure. A current $I_{GE}$ is flowing from the terminal G toward the terminal E. The inventors have noted that the path of the current $I_{GE}$ in the stack 31 then has the property of imposing an orientation on the magnetization 35 of the programmable magnetic layer 34. The path of the current in the stack and the action on the spins of the electrons resulting therefrom are not uniform in the entire programmable layer 34. It is therefore remarkable that an imposed orientation extends to the magnetization of the entire programmable layer 34. In this example, the orientation 54, oriented from the lower layer 32 toward the upper layer 36, is imposed on the magnetization 35.

In view V2 in the bottom left of FIG. 4, the terminal E is located at the bottom of the figure. A current $I_{EG}$ flows in the memory cell 30 from the terminal E toward the terminal G. In top view, the memory cell 30 is symmetrical relative to the center of the stack 31. The path of the current $I_{EG}$ in the stack 31 is therefore identical to the path of the current $I_{GE}$. Thus, the orientation 54 of the magnetization 35 is in the same direction as in view V1. The orientation imposed on the magnetization 35 of the programmable layer 34 does not depend on the flow direction of the current flowing across the terminals E and G.

In view V3 in the top right of FIG. 4, the terminal D is located at the top of the figure. A current $I_{FD}$ flows in the memory cell 30 from the terminal F toward the terminal D. The path of the current $I_{FD}$ in the stack 31 is the mirror image of the path of the current $I_{GE}$ in view V1. The mirror is perpendicular to the plane of FIG. 4 and parallel to the arms in which the current flows. The action on the spins of the localized electrons responsible for the magnetization resulting from the passage of the current $I_{FD}$ is, relative to the mirror, anti-symmetrical to the action resulting from the passage of the current $I_{GE}$. Thus, an orientation 59, which is the reverse of the orientation 54 of views V1 and V2, is imposed on the magnetization 35 of the programmable magnetic layer 34.

In view V4 in the bottom right of FIG. 4, the terminal D is located at the bottom of the figure. A current $I_{DF}$ flows in the memory cell 30 from the terminal D toward the terminal F. The path of the current $I_{DF}$ in the stack 31 from the terminal D toward the terminal F is identical to the path of the current $I_{FD}$ of view V3. As a result, the orientation of the magnetization of the programmable layer does not depend on the direction of the current flowing across the terminals D and F.

Figure 1B:
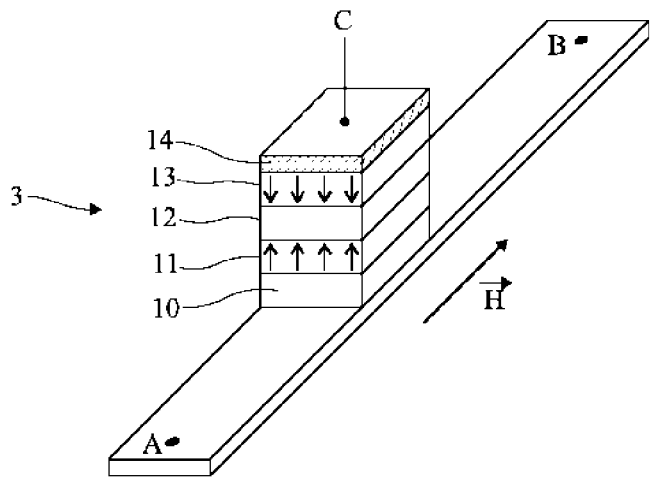
Figure 1C:
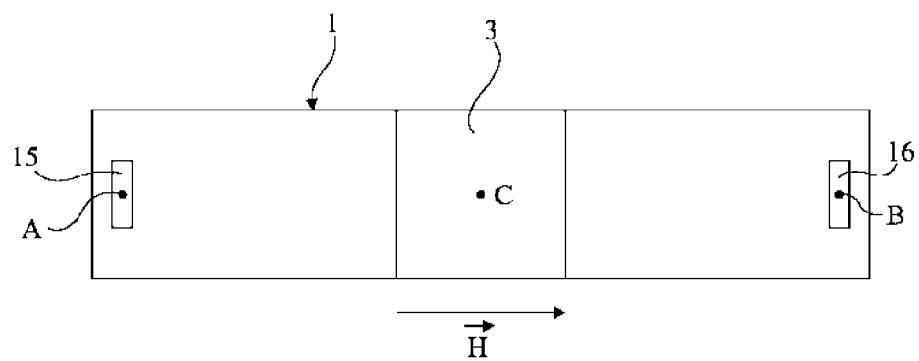
FIG. 1C is a simplified top view of the magnetic memory cell illustrated in FIGS. 1A and 1B.
Figure 2:
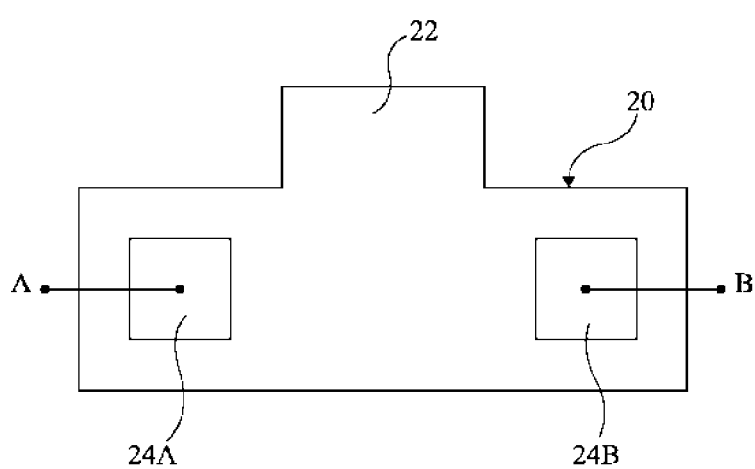
FIG. 2 is a schematic top view of a magnetic memory cell.

The reading of the memory cell 30 is obtained, in a manner similar to the reading described in connection with FIGS. 1A and 1B, by measuring a resistance across the terminal C and any one of the terminals D, E, F and G. The upper layers 38 and 40, as well as the terminal C, constitute a reading assembly. Alternatively, the reading assembly can be omitted, and replaced for example by an electronic reading device using the extraordinary Hall effect or an optical reading device.

FIGS. 5A to 5E are schematic top views of other embodiments of a magnetic memory cell. For clarity reasons, elements of the memory cells described in connection with FIGS. 5A to 5E and elements of the memory cell described in connection with FIGS. 3A and 3B having the same role are designated using the same references.

Each of the magnetic memory cells illustrated in FIGS. 5A to 5E comprises a stack positioned on a metallization. Each stack comprises a portion of a stack of layers similar to the stack of layers of the stack 31 described in connection with FIGS. 3A and 3B. Each stack is topped by a contact with a terminal C.

Figure 5A:
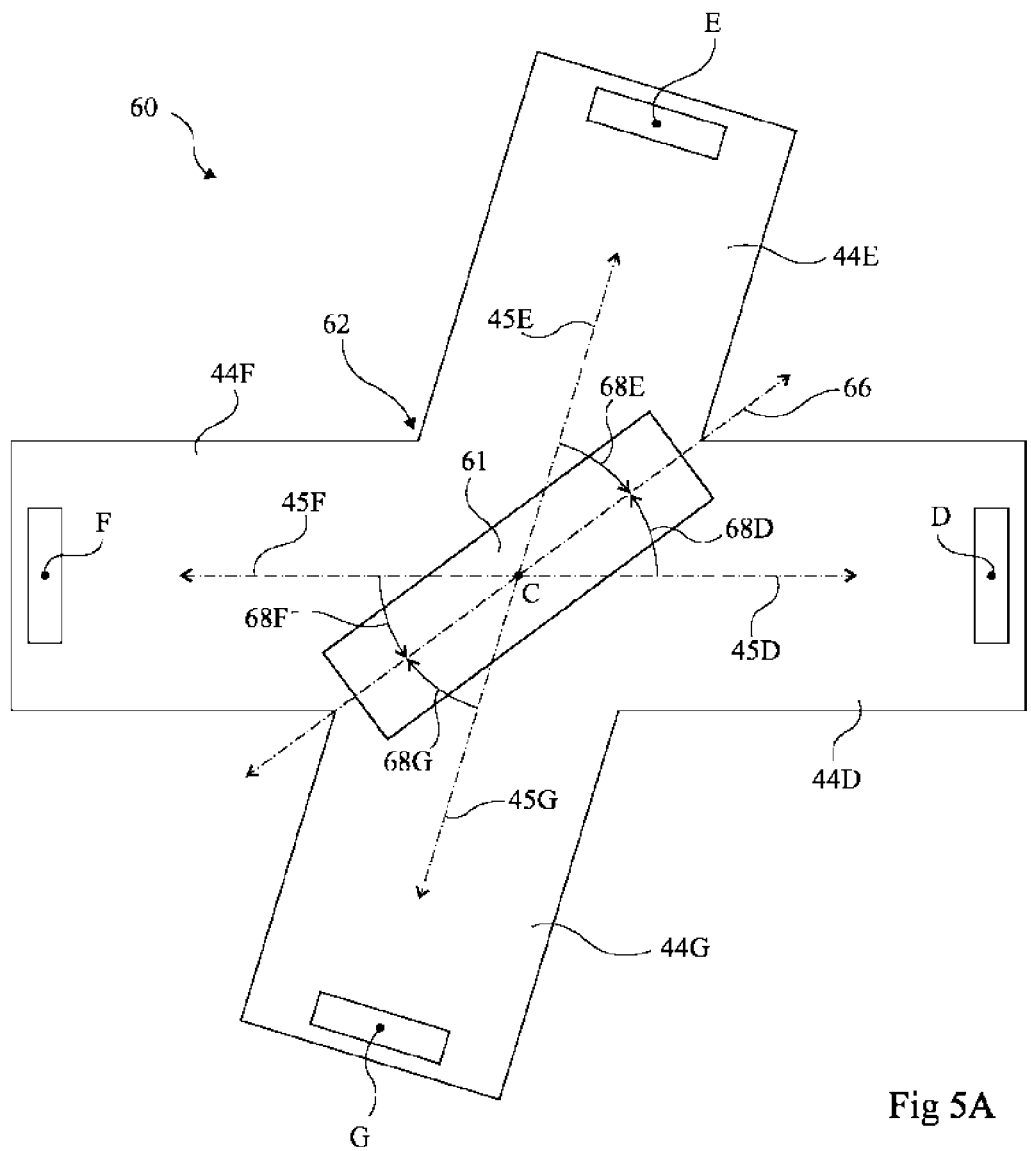
FIGS. 5A to 5E are schematic top views of other embodiments of a magnetic memory cell.

In FIG. 5A, a magnetic memory cell 60 comprises a stack 61 positioned on a metallization 62 and extending by four arms 44D, 44E, 44F and 44G. The arms 44D and 44F extend in two opposite directions along median axes 45E and 45G that are substantially collinear. The arms 44E and 44G extend in two opposite directions along median axes 45E and 45G that are substantially collinear. The stack 61 is centered on a meeting point of the axes 45E and 45G and is in the shape of a rectangle elongated in a direction 66 forming acute angles with the median axes and relative to each other, for example comprised between 30 and 45°.

In top view, the acute angles 68D and 68F between the axes 45D and 45F and the direction 66 are oriented in the counterclockwise direction. The acute angles 68E and 68G between the axes 45E and 45G and the direction 66 are oriented in the clockwise direction. The memory cell 60 is symmetrical relative to the center of the stack 61. Furthermore, the memory cell is symmetrical relative to a mirror perpendicular to the plane of FIG. 5B and containing the axis 66. Thus, the operation of the memory cell 60 is similar to the operation described in connection with FIGS. 4A to 4D, four programming currents flowing across the terminals E and F or across the terminals E and G.

Figure 5B:
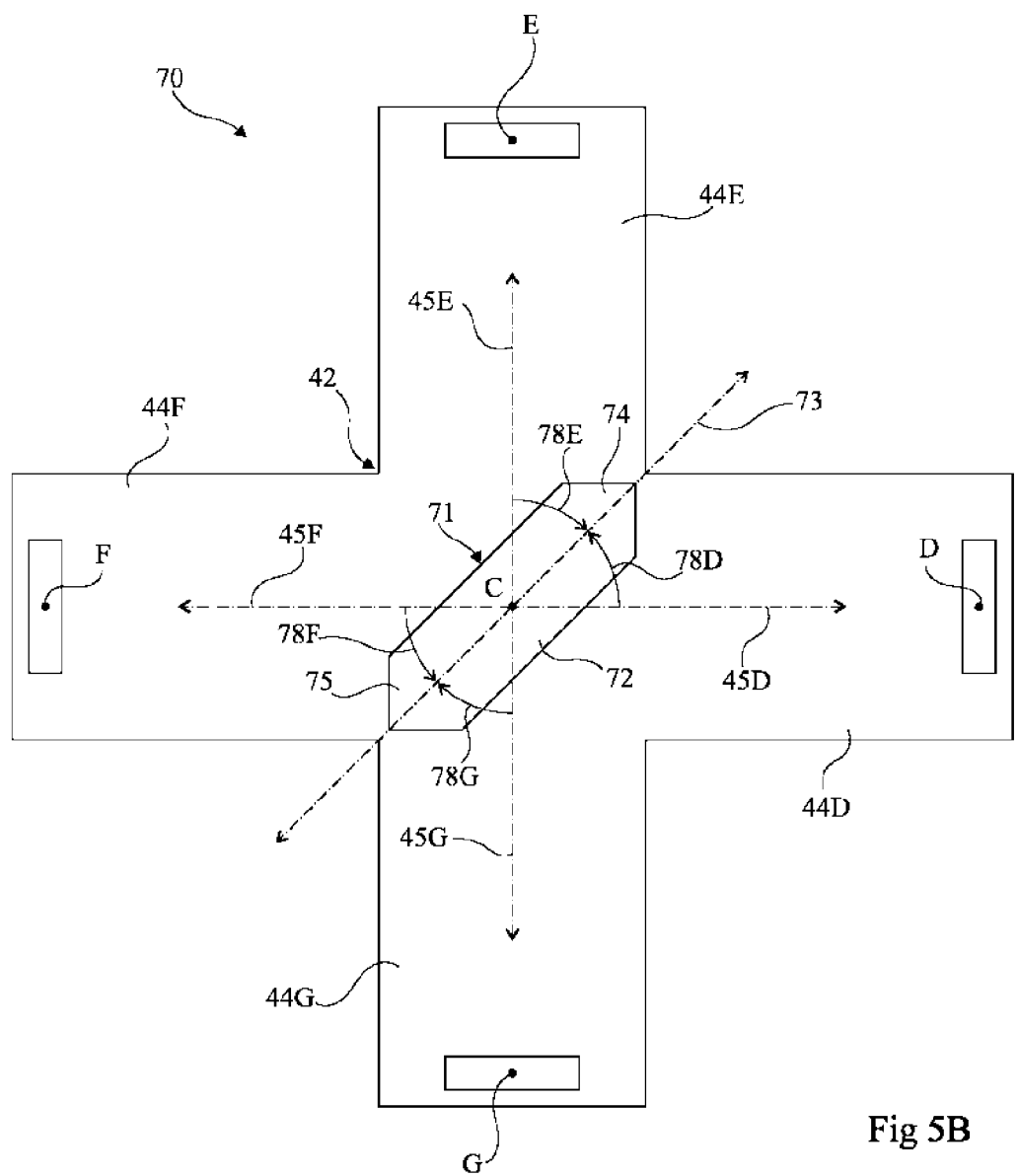

In FIG. 5B, a magnetic memory cell 70 comprises a stack 71 positioned at the center of the metallization 42 in cross form described in connection with FIGS. 3A and 3B. The stack 71 comprises a central portion 72 with a rectangular shape elongated in a direction 73 forming acute angles substantially equal to 45 degrees with the axes 45D, 45E, 45F and 45G. The portion 72 extends from each of its small sides by portions 74 and 75 in tip form in the direction 73.

The acute angles 78D and 78F between the respective axes 45D and 45F of the opposite arms 44D and 44F and the direction 73 are oriented in the counterclockwise direction. The acute angles 78E and 78G between the respective axes 45E and 45G of the opposite arms 44E and 44G and the direction 73 are oriented in the clockwise direction.

The memory cell 70 has the same symmetries as the memory cell 30 described in connection with FIGS. 3A and 3B. Thus, the operation of the memory cell 70 is similar to the operation of the memory cell 30.

Furthermore, the inventors have observed that the presence of tip-forming portions 74, 75 in the parts of the stack close to the arms has the advantage of making it possible to program the memory cell with a weaker current.

Alternatively, the central portion 72 can be omitted. The two portions 74 and 75 then form the tips of a diamond positioned at the center of the cross and elongated in the direction 73.

Figure 5C:
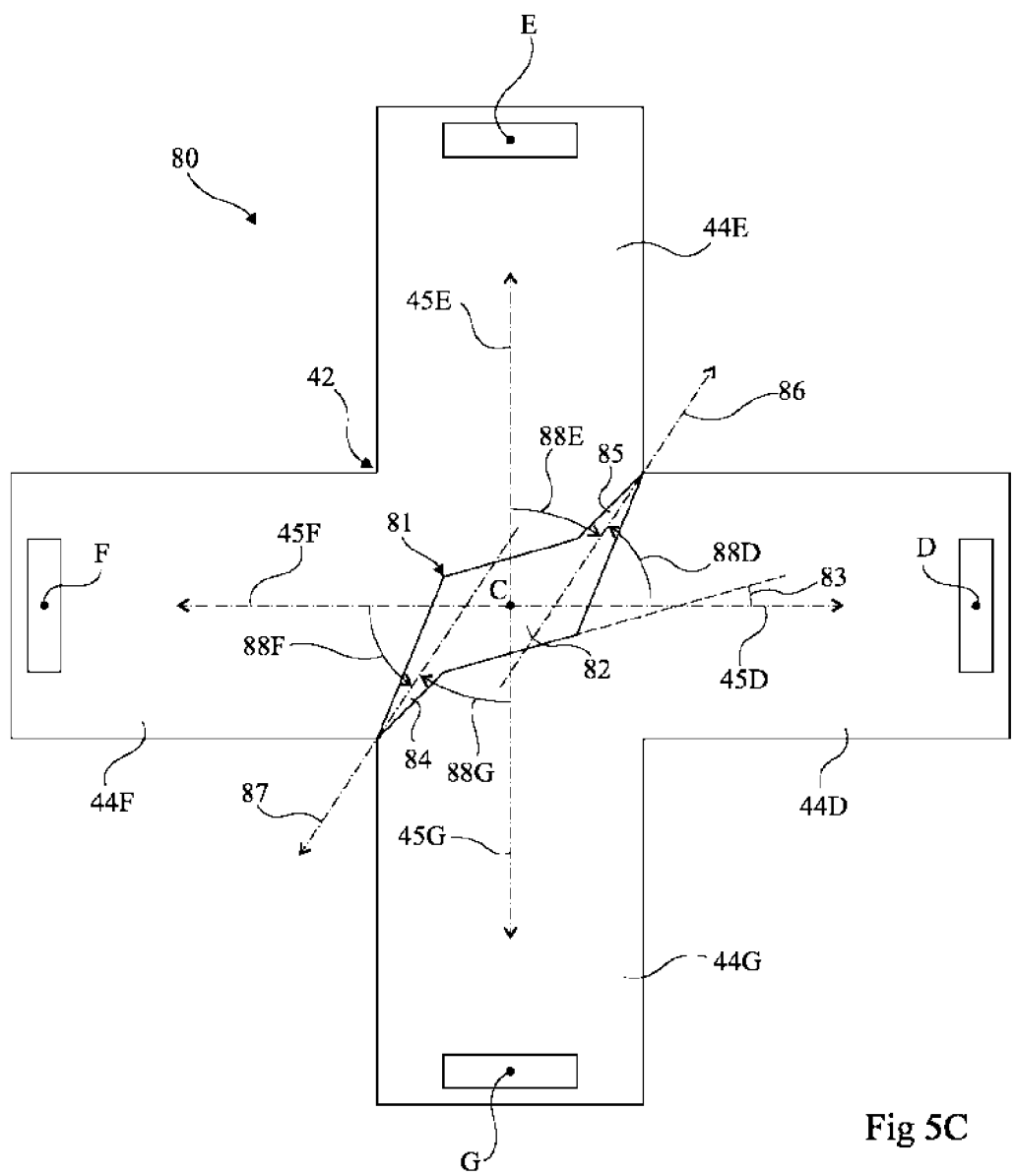

In FIG. 5C, a magnetic memory cell 80 comprises a stack 81 positioned at the center of the metallization 42 described in connection with FIGS. 3A and 3B. The stack 81 comprises a parallelogram-shaped central portion 82 whereof the large sides form an acute angle 83 smaller than 45° with the direction 45D. The central portion 82 extends from each of its small sides by tip-forming portions 84 and 85 in respective directions 86 and 87 forming acute angles with the axes 45D, 45E, 45F and 45G. The tip of the portion 85 is for example situated substantially at the meeting point between an edge of the arm 44D and an edge of the arm 44E. The tip of the portion 85 is for example situated substantially at the meeting point between an edge of the arm 44F and an edge of the arm 44G. The acute angles 88D and 88F between the respective axes 45D and 45F and the direction 86 are oriented in the counterclockwise direction. The acute angles 88E and 88G between the respective axes 45E and 45G and the direction 87 are oriented in the clockwise direction. In top view, the memory cell 80 is symmetrical relative to the center of the stack 81. It can be deduced from this that the programming imposed by the passage of a current across opposite terminals does not depend on the direction of the current.

As an example, the acute angle 83 is about 15°. The acute angles 88D and 88F can be about 45°.

The memory cell 80 is not symmetrical relative to a mirror. However, like in the magnetic cell 30 described in connection with FIGS. 3A and 3B, a current flowing from one of the arms 44D or 44F toward the stack sees, on its right, the part of the stack closest to it. A current flowing from one of the arms 44E or 44G toward the stack sees, on its left, the part of the stack closest to it. This configuration of the stack relative to the arms provides the memory cell 80 with an operation identical to the operation of the memory cell 30 of FIGS. 3A, 3B and 4.

Indeed, when a current flows across the terminals D and F of the memory cell 30 and when a current flows across the terminals D and F of the memory cell 80, these currents have similar paths in the parts of the stacks closest to the arms 44D. Likewise, these two currents have similar paths in the parts of the stacks closest to the arms 44F. Yet these parts of the stacks closest to the arms determine the orientation imposed on the magnetization of the programmable layer 34. This is why, when a current flows from the terminal D toward the terminal F, the orientation imposed on the magnetization of the programmable layers is identical in the memory cell 80 and in the memory cell 30. The same is true for currents flowing from the terminal F toward the terminal D, from the terminal E toward the terminal G, and from the terminal G toward the terminal E.

The memory cell 80 can have tip-forming portions 84 and 85 more acute than the portions 74 and 75 of the memory cell 70, which has the advantage of allowing the use of reduced write currents to program the memory cell.

Figure 5D:
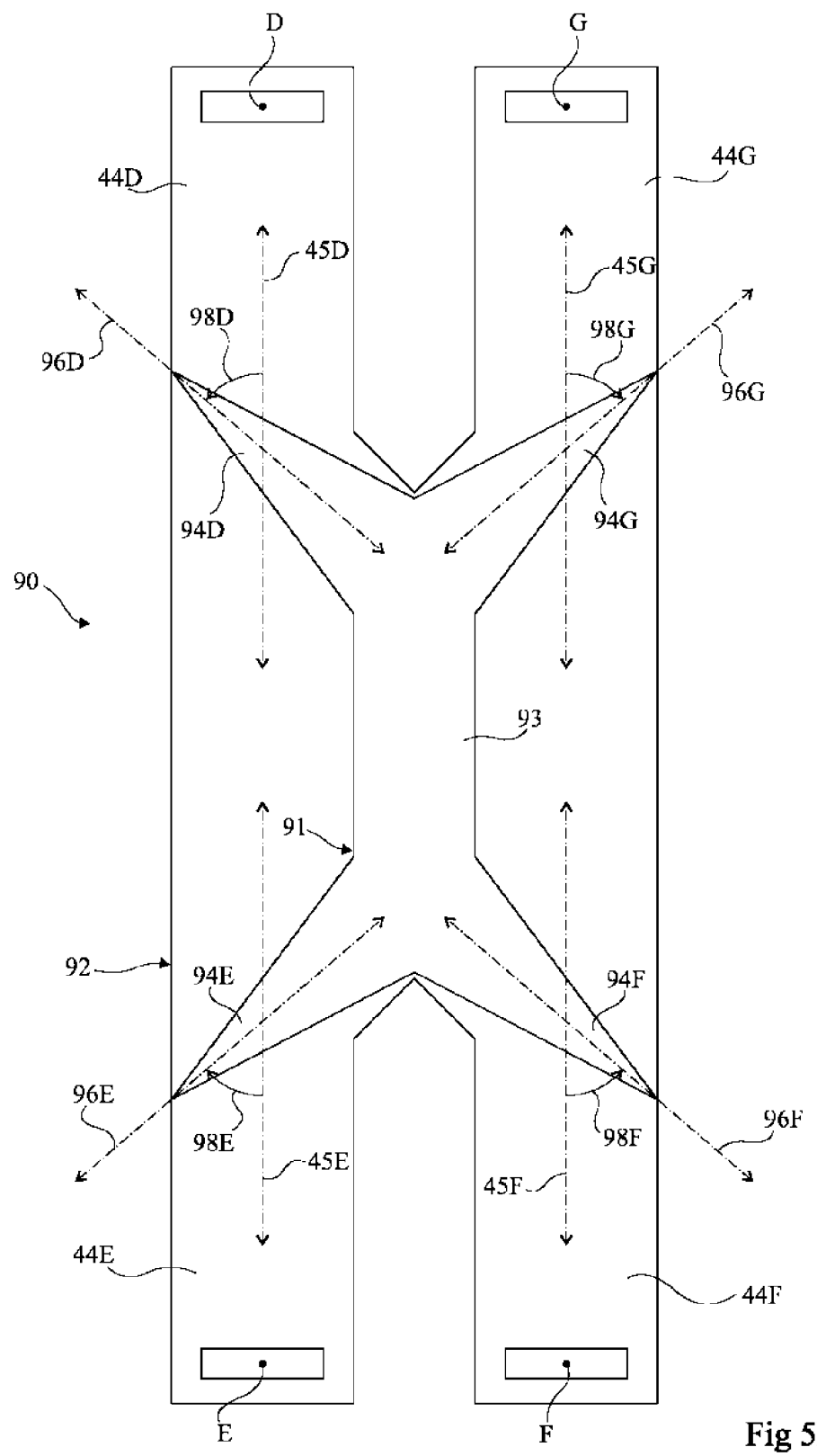

In FIG. 5D, a magnetic memory cell 90 comprises a stack 91 positioned on a metallization 92 extending by four arms 44D, 44E, 44F and 44G. The arms 44D and 44E extend in two opposite directions along respective median axes 45D and 45E that are substantially collinear. The arms 44F and 44G extend substantially parallel to the arms 44F and 44G in two opposite directions along respective median axes 45F and 45G that are substantially collinear. The arms 44D and 44E are on a same side of the metallization 92. The stack 91 comprises an elongated central rectangular portion 93 centered between the arms. For each respective arm 44D, 44E, 44F, 44G, the central portion 93 extends, from its small side closest to the arm, by an elongated portion 94D, 94E, 94F, 94G in a direction 96D, 96E, 96F, 96G forming an acute angle with the arm. Each elongated portion 94D, 94E, 94F, 94G is in the form of a tip that approaches the edge of the respective arm 44D, 44E, 44F, 44G furthest from the central portion 93. The acute angle 98D between the axis 45D and the direction 96D is oriented in the counterclockwise direction. The acute angle 98E between the axis 45E and the direction 96E is oriented in the clockwise direction.

The acute angle 98F between the axis 45F and the direction 96F is oriented in the counterclockwise direction. The acute angle 98G between the axis 45G and the direction 96G is oriented in the clockwise direction. Furthermore, the memory cell 90 has the same symmetries as the memory cell 30 described in relation to FIGS. 3A and 3B. Thus, the operation of the memory cell 90 is similar to the operation of the memory cell 34 programming currents flowing across the terminals D and F or across the terminals E and G.

As an example, the acute angles 98D, 98E, 98F, 98G are approximately equal and about 45°.

The memory cell 90 has the advantage of including portions 94D, 94E, 94F, 94G in tip form making it possible program the memory cell with a weaker current. The memory cell 90 further has the advantage of being powered by parallel arms, the arrangement of which facilitates the integration of the memory cell into an electronic component, for example in a memory including many memory cells.

Figure 5E:
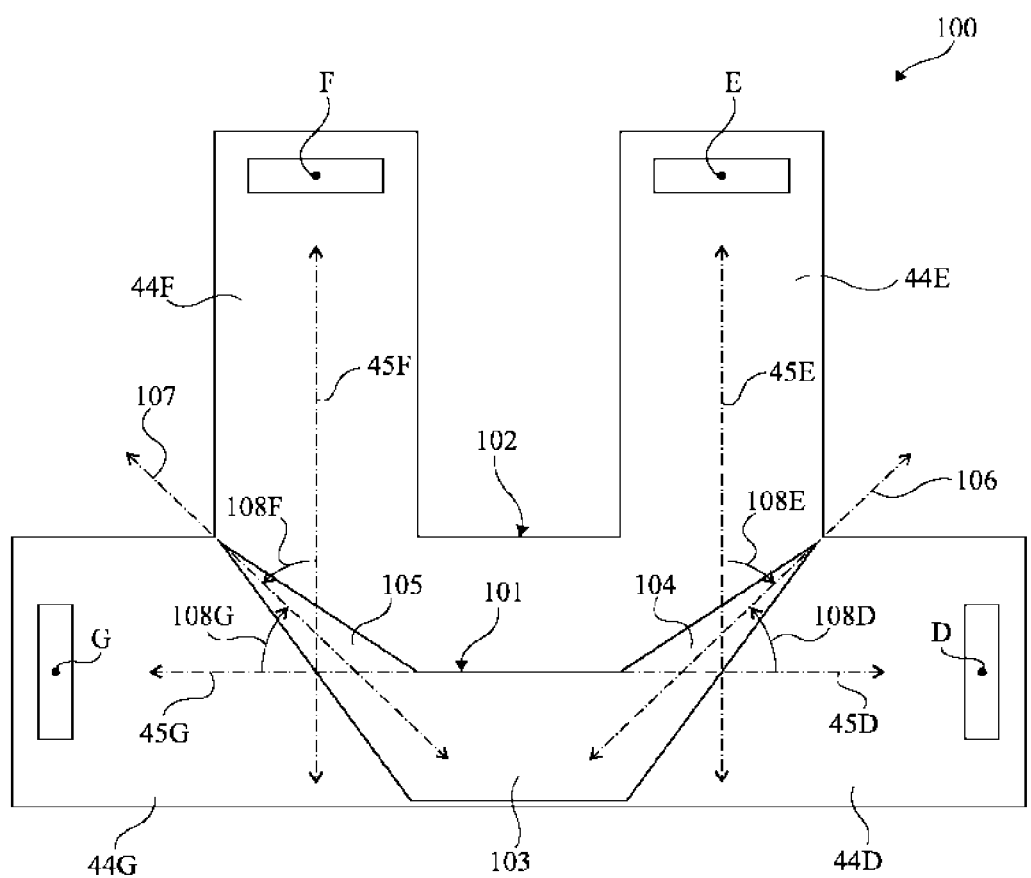

In FIG. 5E, a magnetic memory cell 100 comprises a stack 101 positioned on a metallization 102 extending by four arms 44D, 44E, 44F and 44G. The arms 44D and 44G extend in two opposite directions along respective median axes 45D and 45G that are substantially collinear. The arms 44E and 44F extend on the same side of the arms 44D and 44G in a direction substantially perpendicular to the axes 45D and 45G, along median axes 45E and 45F. The stack 101 comprises a rectangular central portion 103 elongated along the axis 45D. The central portion 103 is located between the arms 44E and 44F and is found for the majority on the side of the axes 45D and 45G opposite the arms 44E and 44F. The central portion 103 extends by each of its small sides by elongated portions 104 and 105 in tip form. The portion 104 is located across from the arms 44D and 44E and extends in a direction 106 while approaching the meeting point between one side of the arm 44D and one side of the arm 44E. The portion 105 is situated across from the arms 44F and 44G and extends in a direction 107 while coming closer to the meeting point between a side of the arm 44F and a side of the arm 44G. The acute angle 108D between the axis 45D and the direction 106 is oriented in the counterclockwise direction. The acute angle 108F between the axis 45F and the direction 107 is oriented in the counterclockwise direction. The acute angle 108E between the axis 45E and the direction 106 is oriented in the clockwise direction. The acute angle 108G between the axis 45G and the direction 107 is oriented in the clockwise direction. As an example, the acute angle 108D is about 45°. The acute angle 108E can be about 45°.

In the configuration of the memory cell 100, a current flowing in one or the other of the arms 44D and 44F toward the stack along the axes 45D and 45F sees, on its right, the part of the stack closest to it. A current flowing in one or the other of the arms 44E and 44G toward the stack along the axes 45E and 45G sees, on its left, the part of the stack closest to it. Thus, the operation of the memory cell 100 is similar to the operation of the memory cell 80 described in connection with FIG. 5D.

The arrangement of the arms can facilitate the implementation of the memory cell 100, for example in an electronic device such as a memory comprising many memory cells.

Alternatively, the arm 44E of the memory cell 100 can be replaced by an arm 44E symmetrical to the arm 44E shown in FIG. 5E relative to the axis 45D. It will be noted that in this alternative, the acute angle 108E and its orientation are not modified.

As an example, the dimensions of the arms 44D to 44F of FIGS. 3A, 3B and 5A to 5E measured in a direction orthogonal to the median axes 45D to 45G, are comprised between 10 nm and 200 nm.

The current used to program the magnetic cell is for example comprised between $10^5$ A/cm$^2$ and $10^8$ A/cm$^2$.

The programmable magnetic layer can include an alloy having a specific perpendicular magnetic anisotropy, in particular FePt, FePd, CoPt, or a rare earth/transition metal alloy, in particular GdCo, TdFeCo. The programmable magnetic layer may include a metal or an alloy having, in the stack, a perpendicular magnetic anisotropy induced by the interfaces, in particular Co, Fe, CoFe, Ni, CoNi.

One of the layers 32, 36 sandwiching the programmable magnetic layer 34 can be a nonmagnetic metal, such as Pt, W, Ir, Ru, Pd, Cu, Au, Bi, Hf or an alloy of these metals or in the form of a stack of several layers of each of these metals.

The conductive layer 32 can be made from a nonmagnetic or anti-ferromagnetic material. Examples of anti-ferromagnetic materials include Mn-based alloys such as IrMn, FeMn, PtMn, or alloys of these compounds such as PtFeMn or oxides such as CoOx or NiOx. The conductivity of the lower layer 32 must be sufficient to allow the passage of a current in the write phase.

The nonmagnetic layer 36 topping the programmable magnetic layer can be made from a dielectric oxide such as SiOx, AlOx, MgOx, TaOx, HfOx, or a dielectric nitride such as SiN, BNx, with a thickness able to allow a tunnel effect.

The thickness of one of the layers 32, 36 sandwiching the programmable magnetic layer can be comprised between 0.5 nm and 200 nm, more particularly between 0.5 nm and 100 nm, and preferably less than 3 nm.

The thickness of the programmable magnetic layer can be less than 3 nm.

The magnetic layer 38 of the write assembly can be made from a magnetic material, or a compound of magnetic materials, or comprise several layers of magnetic and nonmagnetic materials.

One advantage of the magnetic memory cells described above is that the programming current can be alternating, and that if it is direct, there is no need to worry about its direction.

Specific embodiments have been described. Various alternatives and changes will appear to one skilled in the art. In particular, although specific configurations of stacks arranged on a metallization have been described, other configurations are possible as long as, for each arm, an outside observer placed on the arm looking at the stack in the direction of the median axis of the arm sees the part of the stack closest to the arm for the majority on his left for two of the arms, and for the majority on his right for the other two arms.

Furthermore, although the stacks of the magnetic memory cells described above all have shapes with sharp corners, the actual shapes can be rounded. In particular, the tips can be rounded, the curve radius preferably being comprised between 1 and 10 nm.

Furthermore, the term "metallization" must be interpreted as designating a metal or nonmetal conducting material, for example a doped semiconductor.

Furthermore, although in the described memory cells, the programming layer is covered with a nonmagnetic layer, this nonmagnetic layer can be replaced by a magnetic layer or comprise several layers of magnetic and nonmagnetic materials, the important point being for the layers sandwiching the program layer to be different.

Furthermore, although in the described memory cells the metallizations extend by straight arms, these metallizations can also extend by curved arms having, in their parts closest to the stack, the same direction as the straight arms, and having median axes defined by the median axes of the straight arms.

The invention claimed is:
1. A magnetic memory cell, comprising:
a stack including a magnetic layer section between a conductive layer section and a section of the layer that is different from the conductive layer, the magnetic layer having a magnetization perpendicular to a plane of the layers;
a metallization section on which the stack is placed and having, in top view, the shape of a cross with four metallization arms, respectively first, second, third and fourth metallization arms, each metallization arm having a median axis and a contact located at the end of the metallization arm,
wherein, a current flowing in a metallization arm from the contact of said metallization arm towards the stack, parallel to the median axis of said metallization arm, sees a closest part of the stack on its left for the first and second arms, and on its right for the third and fourth arms,
the closest part of the stack for a metallization arm being a part of the stack that is the closest to the contact of said metallization arm, when evaluated along the median axis of said metallization arm.
2. The magnetic memory cell according to claim 1, wherein the magnetic layer has a thickness smaller than 3 nm.
3. The magnetic memory cell according to claim 1, having a center of symmetry in top view.
4. The magnetic memory cell according to claim 1, having a plane of symmetry perpendicular to the plane of the layers, the first and third metallization arms being symmetrical to one another relative to the plane of symmetry and at the second and fourth metallization arms being symmetrical to one another relative to the plane of symmetry.

5. The magnetic memory cell according to claim 1, wherein, for each arm, the closest part of the stack for a metallization arm considered comprises a portion elongated in a direction forming, in top view, an acute angle with the median axis of the metallization arm considered.

6. The magnetic memory cell according to claim 5, wherein at least one of said acute angles is comprised between 30° and 60°.

7. The magnetic memory cell according to claim 5, wherein at least one of said elongated portions forms a tip.

8. The magnetic memory cell according to claim 5, wherein at least one of said elongated portions forms a rounded tip.

9. The magnetic memory cell according to claim 5, wherein the metallization section and the first, second, third and fourth metallization arms form a cross, the stack being elongated and being positioned at the center of the cross.

10. The magnetic memory cell according to claim 9, wherein the stack comprises a central portion elongated in a direction forming an angle comprised between 0° and 30°, with the median axis of the third metallization arm.

11. The magnetic memory cell according to claim 9, wherein the stack comprises a central portion elongated in a direction forming an angle comprised between 5° and 25°, with the median axis of the third arm.

12. The magnetic memory cell according to claim 5, wherein the median axes of the first and second metallization arms are collinear and the median axes of the third and fourth metallization arms are collinear, the stack having an elongated shape centered on the meeting point of the median axes, and said acute angles being comprised between 30° and 45°.

13. The magnetic memory cell according to claim 5, wherein the median axes of the first and third metallization arms are collinear and the median axes of the second and fourth metallization arms are collinear, the median axes of the first and second metallization arms being parallel, and the first and second metallization arms extending in opposite directions.

14. The magnetic memory cell according to claim 5, wherein the median axis of the second and third metallization arms are collinear and the median axis of the first and fourth metallization arms are orthogonal to the median axes of the first and third metallization arms.

15. A method for programming the magnetic memory cell according to claim 1, comprising passing a first current between the first and second metallization arms or a second current between the third and fourth metallization arms.

16. The method according to claim 15, wherein the first or second current is an alternating current.

* * * * *